(12) United States Patent
Chen et al.

(10) Patent No.: US 9,589,977 B1
(45) Date of Patent: Mar. 7, 2017

(54) NON-VOLATILE MEMORY AND FABRICATING METHOD THEREOF

(71) Applicant: United Microelectronics Corp., Hsinchu (TW)

(72) Inventors: Ko-Chi Chen, Taoyuan (TW); Shen-De Wang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/963,833

(22) Filed: Dec. 9, 2015

(30) Foreign Application Priority Data

Oct. 30, 2015 (CN) .......................... 2015 1 0724303

(51) Int. Cl.
| | | |
|---|---|---|
| H01L 29/792 | (2006.01) |
| H01L 27/115 | (2006.01) |
| H01L 29/66 | (2006.01) |
| H01L 29/423 | (2006.01) |
| H01L 29/40 | (2006.01) |
| H01L 21/28 | (2006.01) |

(52) U.S. Cl.
CPC .... H01L 27/1157 (2013.01); H01L 21/28282 (2013.01); H01L 29/408 (2013.01); H01L 29/42344 (2013.01); H01L 29/66833 (2013.01); H01L 29/792 (2013.01)

(58) Field of Classification Search
USPC ...... 257/314–326, E27.078, E29.3–E29.309, 257/255–266, E21.179–E21.182, 257/E21.209–E21.21, E21.422, E21.423, 257/E21.679–E21.694, E27.103, 257/E21.546, E29.129, E29.331, 257/E27.093, 301, 510; 438/201, 288, 438/573, 652, 954
See application file for complete search history.

(56) References Cited

U.S. PATENT DOCUMENTS

| | | | |
|---|---|---|---|
| 5,315,142 A | 5/1994 | Acovic et al. | |
| 7,642,594 B2 | 1/2010 | Chindalore et al. | |
| 9,379,121 B1* | 6/2016 | Chen ................. | H01L 27/11521 |
| 2009/0042350 A1* | 2/2009 | Yang ................. | G11C 16/0466 438/287 |
| 2010/0252873 A1* | 10/2010 | Cheng ................. | H01L 21/84 257/301 |
| 2014/0225262 A1* | 8/2014 | Tseng ................. | H01L 23/485 257/751 |

* cited by examiner

Primary Examiner — Dao H Nguyen
Assistant Examiner — Tram H Nguyen
(74) Attorney, Agent, or Firm — J.C. Patents

(57) ABSTRACT

The invention provides a non-volatile memory and a fabricating method thereof. The non-volatile memory includes a substrate, an embedded-type charge storage transistor, and a selection transistor. The substrate has an opening. The embedded-type charge storage transistor is disposed in the substrate. The embedded-type charge storage transistor includes a charge storage structure and a conductive layer. The charge storage structure is disposed on the substrate in the opening. The conductive layer is disposed on the charge storage structure and fills the opening. The selection transistor is disposed on the substrate at one side of the embedded-type charge storage transistor, wherein the selection transistor includes a metal gate structure. The non-volatile memory has excellent charge storage capacity.

18 Claims, 6 Drawing Sheets

NON-VOLATILE MEMORY AND FABRICATING METHOD THEREOF

CROSS-REFERENCE TO RELATED APPLICATION

This application claims the priority benefit of China application serial no. 201510724303.2, filed on Oct. 30, 2015. The entirety of the above-mentioned patent application is hereby incorporated by reference herein and made a part of this specification.

BACKGROUND OF THE INVENTION

Field of the Invention

The invention relates to a memory, and particularly related to a non-volatile memory.

Description of Related Art

A split gate non-volatile memory has a selection transistor and a charge storage transistor, so as to read, write, and erase data in a memory. As transistor technology progresses, high-k materials reduce gate leakage, and the use of a metal gate allows for faster processing speed. As a result, non-volatile memory structures using high-k metal gate transistors are developed.

However, when a metal gate integrated in the charge storage transistor of a non-volatile memory has a high-k material layer, since the high-k material layer easily traps charge, charges cannot be readily stored in the charge storage layer, such that the charge storage capacity of the memory is reduced.

SUMMARY OF THE INVENTION

Accordingly, the invention provides a non-volatile memory capable of improved charge storage capacity.

The invention provides a non-volatile memory including a substrate, an embedded-type charge storage transistor, and a selection transistor. The substrate has an opening. The embedded-type charge storage transistor is disposed in the substrate. The embedded-type charge storage transistor includes a charge storage structure and a conductive layer. The charge storage structure is disposed on the substrate in the opening. The conductive layer is disposed on the charge storage structure and fills the opening. The selection transistor is disposed on the substrate at one side of the embedded-type charge storage transistor. The selection transistor includes a metal gate structure.

According to an embodiment of the invention, the non-volatile memory further includes a first doped region disposed in the substrate along the opening.

According to an embodiment of the invention, in the above non-volatile memory, the charge storage structure includes a charge trapping layer.

According to an embodiment of the invention, in the non-volatile memory, the charge trapping layer includes silicon nitride or nano-dots.

According to an embodiment of the invention, in the non-volatile memory, the charge storage structure further includes a first dielectric layer and a second dielectric layer. The first dielectric layer is disposed between the charge trapping layer and the substrate. The second dielectric layer is disposed between the charge trapping layer and the conductive layer.

According to an embodiment of the invention, in the non-volatile memory, the embedded-type charge storage transistor further includes a second doped region and a third doped region. The second doped region and the third doped region are disposed in the substrate at two sides of the conductive layer. The selection transistor further includes the second doped region and a fourth doped region. The second doped region and the fourth doped region are disposed in the substrate at two sides of the metal gate structure. The embedded-type charge storage transistor and the selection transistor share the second doped region.

According to an embodiment of the invention, the non-volatile memory further includes a plurality of metal silicide layers. The metal silicide layers are respectively disposed on the conductive layer, the second doped region, the third doped region, and the fourth doped region.

According to an embodiment of the invention, in the non-volatile memory, the metal gate structure includes a high-k dielectric layer, a work function metal layer, and a metal gate layer. The high-k dielectric layer, the work function metal layer, and the metal gate layer are sequentially disposed on the substrate.

According to an embodiment of the invention, in the non-volatile memory, the metal gate structure further includes a gate dielectric layer. The gate dielectric layer is disposed between the high-k dielectric layer and the substrate.

According to an embodiment of the invention, in the non-volatile memory, a portion of the conductive layer may protrude beyond a top surface of the substrate.

The invention provides a method for fabricating a non-volatile memory including the following steps. A substrate having an opening is provided. An embedded-type charge storage transistor is formed in the substrate. The embedded-type charge storage transistor includes a charge storage structure and a conductive layer. The charge storage structure is disposed on the substrate in the opening. The conductive layer is disposed on the charge storage structure and fills the opening. A selection transistor is formed on the substrate at one side of the embedded-type charge storage transistor. The selection transistor includes a metal gate structure.

According to an embodiment of the invention, the method for fabricating the non-volatile memory further includes forming a first doped region in the substrate along the opening.

According to one embodiment of the invention, in the method for fabricating the non-volatile memory, a method of foiming the charge storage structure and the conductive layer include the following steps. A charge storage structure layer is conformally formed in the opening. A conductive material layer is formed on the charge storage structure layer and fills the opening. The conductive material layer and the charge storage structure layer outside the opening are removed.

According to an embodiment of the invention, in the method for fabricating the non-volatile memory, a method of removing the conductive material layer and the charge storage structure layer outside the opening includes chemical mechanical polishing or a combination of chemical mechanical polishing and etching back.

According to an embodiment of the invention, in the method for fabricating the non-volatile memory, a method of forming the metal gate structure includes the following steps. A dummy gate structure is formed on the substrate. The dummy gate structure includes a high-k dielectric layer, a dummy gate, and a hard mask layer. The high-k dielectric layer is disposed on the substrate. The dummy gate is disposed on the high-k dielectric layer. The hard mask layer is disposed on the dummy gate. A dielectric material layer covering the dummy gate structure is formed. A portion of the dielectric material layer and the hard mask layer is removed to expose the dummy gate. The dummy gate is removed to form a gate opening. A work function metal layer and a metal gate layer in the gate opening are formed sequentially.

According to an embodiment of the invention, in the method for fabricating the non-volatile memory structure, the method of forming the metal gate structure further includes forming a spacer on a sidewall of the dummy gate structure.

According to an embodiment of the invention, the method for fabricating the non-volatile memory further includes the following steps. A second doped region and a third doped region are formed in the substrate at two sides of the conductive layer. The second doped region and a fourth doped region are formed in the substrate at two sides of the dummy gate structure. The embedded-type charge storage transistor and the selection transistor share the second doped region.

According to an embodiment of the invention, the method for fabricating the non-volatile memory further includes respectively forming a metal silicide layer on the conductive layer, the second doped region, the third doped region, and the fourth doped region before the hard mask layer is removed.

According to an embodiment of the invention, in the method for fabricating the non-volatile memory, the dummy gate structure further includes a gate dielectric layer. The gate dielectric layer is disposed between the high-k dielectric layer and the substrate.

According to an embodiment of the invention, in the method for fabricating the non-volatile memory, a method of forming the work function metal layer and the metal gate structure includes the following steps. A work function metal material layer is conformally formed in the gate opening. A metal gate material layer filling the gate opening is formned on the work function metal material layer. The metal gate material layer and the work function metal material layer outside the gate opening are removed.

Based on the above, in the non-volatile memory and the method for fabricating the non-volatile memory provided in the invention, since the embedded-type charge storage transistor does not adopt a high-k/metal gate transistor structure, the issue of high-k material trapping charges does not occur. As a result, the charges can be stored in the charge storage structure, such that the storage capability of non-volatile memory is increased.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIGS. 1A through 1J are schematic cross-sectional views showing a process of fabricating a non-volatile memory according to an embodiment of the invention.

Figure 1A:
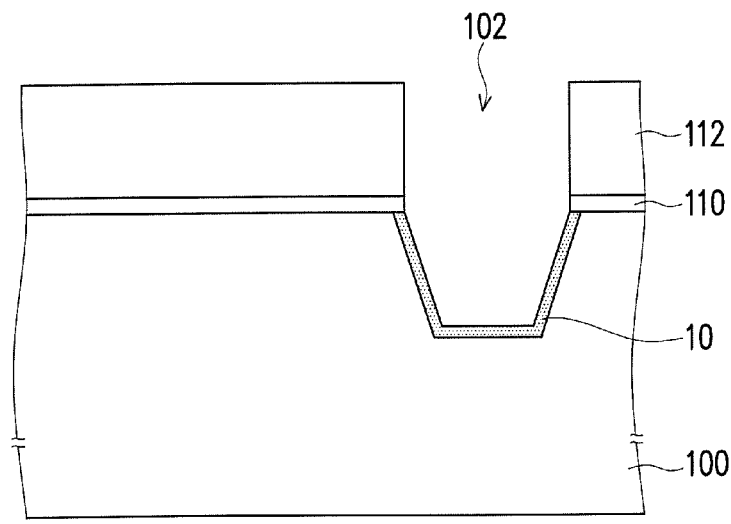
FIGS. 1A through 1J are schematic cross-sectional views showing a process of fabricating a non-volatile memory according to an embodiment of the invention.

Referring to FIG. 1A, a substrate 100 is provided. The substrate 100 is, for instance, a silicon substrate. A patterned pad oxide layer 110 and a patterned hard mask layer 112 are formed on the substrate 100 in order, and then a portion of the substrate 100 exposed from the hard mask layer 112 is removed by an etching process, and an opening 102 is formed in the substrate 100. The material of the patterned hard mask layer 112 may be, for instance, silicon nitride. Although the opening 102 is formed by the method aforementioned, the invention is not limited to the method.

A doped region 10 may be optionally formed in the substrate 100 along the opening 102. The doped region 10 can be used to generate electrons. The method of forming the doped region 10 is, for instance, performing an ion implantation process of different angles to the substrate 100 in the opening 102.

Figure 1B:
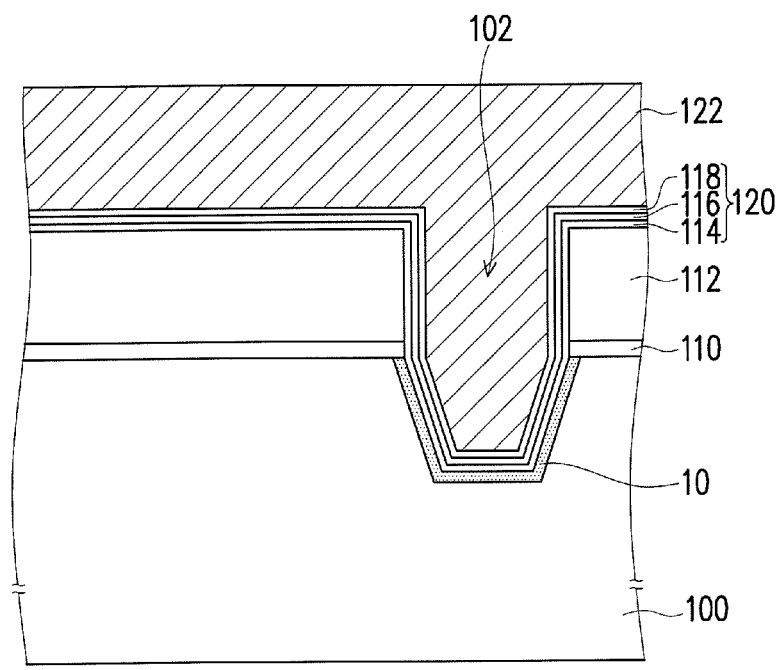

Referring to FIG. 1B, a charge storage structure layer 120 is conformally formed on the substrate 100 in the opening 102. The charge storage structure layer 120 includes a charge trapping material layer 116. The material of the charge trapping material layer 116 includes silicon nitride or nano-dots. The method of forming the charge trapping material layer 116 includes a chemical vapor deposition (CVD) process. The thickness of the charge trapping material layer 116 is, for instance, about 30 to 80 angstroms. The charge storage structure layer 120 may further include a dielectric material layer 114 and a dielectric material layer 118. The dielectric material layer 114 is disposed between the charge trapping material layer 116 and the substrate 100. The dielectric material layer 118 is disposed on the charge trapping material layer 116. The material of the dielectric material layer 114 includes silicon oxide. The dielectric material layer 114 is formed, for instance, by thermal oxidation or a CVD process. The thickness of the dielectric material layer 114 is, for instance, about 15 to 50 angstroms. The material of the dielectric material layer 118 includes silicon oxide. The method of forming the dielectric material layer 118 includes a CVD process. The thickness of the dielectric material layer 118 is, for instance, about 15 to 50 angstroms.

A conductive material layer 122 is formed on the charge storage structure layer 120 and filling the opening 102. The material of the conductive material layer 122 includes doped polysilicon. The method for forming the conductive material layer 122 includes a CVD process.

Figure 1C:
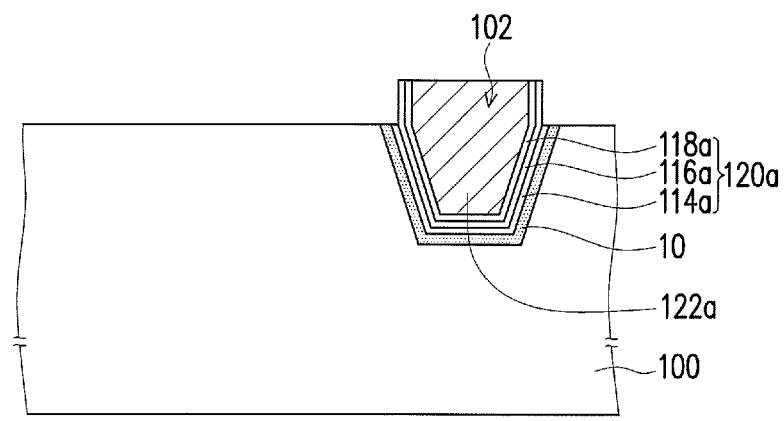

Referring to FIG. 1C, the conductive material layer 122 and the charge storage structure layer 120 outside the opening 102 are removed to form a charge storage structure 120a and a conductive layer 122a. The charge storage structure 120a is disposed on the substrate 100 in the opening 102. The conductive layer 122a is disposed on the charge storage structure 120a and fills the opening 102. A portion of the conductive layer 122a and a portion of the charge storage structure 120a may be protruded beyond the top surface of the substrate 100. The height of the conductive layer 122a and a portion of the charge storage structure 120a protruding beyond the top surface of the substrate 100 is, for instance, about 50 to 100 angstroms. The charge storage structure 120a includes a charge trapping layer 116a, and may further include a dielectric layer 114a and a dielectric layer 118a. The method for removing the conductive material layer 122 and the charge storage structure layer 120 outside the opening 102 includes chemical mechanical polishing or a combination of chemical mechanical polishing and etching back.

The patterned hard mask layer 112 and the patterned pad oxide layer 110 are removed. For instance, the patterned hard mask layer 112 is removed by high temperature phosphoric acid, and the patterned pad oxide layer 110 is removed by a wet etching process. In the steps of removing the patterned oxide layer 110, a portion of the dielectric layer 114a protruding beyond the substrate 100 may be removed.

Figure 1D:
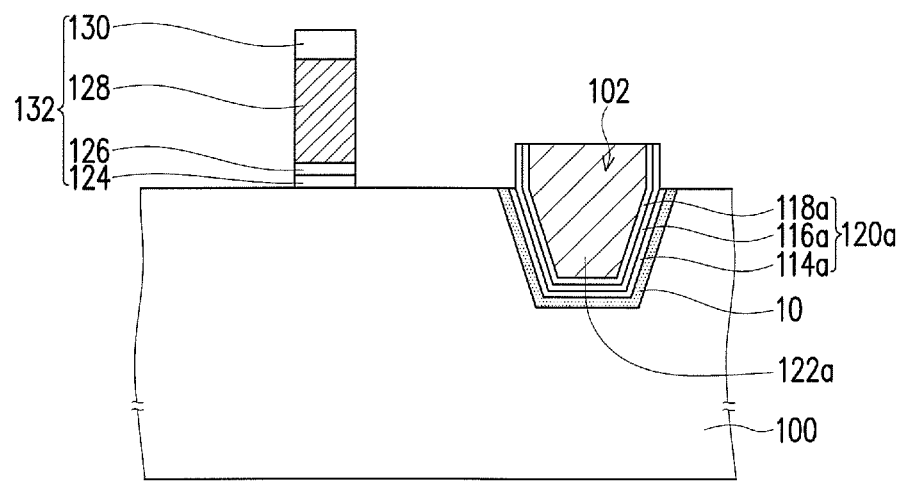

Referring to FIG. 1D, a dummy gate structure 132 is formed on the substrate 100. The dummy gate structure 132 includes a high-k dielectric layer 126, a dummy gate 128, and hard mask layer 130. The high-k dielectric layer 126 is disposed on the substrate 100. The dummy gate 128 is disposed on the high-k dielectric layer 126. The hard mask layer 130 is disposed on the dummy gate 128. The dummy gate structure 132 may further include a gate dielectric layer 124. The gate dielectric layer 124 is disposed between the high-k dielectric layer 126 and the substrate 100. The method of forming the dummy gate structure 132 is, for instance, sequentially forming a gate dielectric material layer, a high-k dielectric material layer, a dummy gate material layer, and a hard mask material layer on the substrate 100 by a deposition process, and then performing a photolithographic and an etching process to the gate dielectric material layer, the high-k dielectric material layer, the dummy gate material layer, and the hard mask material layer. The material of the gate dielectric material layer is, for instance, silicon oxide. The material of the high-k dielectric material layer is, for instance, $Al_2O_3$, $Y_2O_3$, $ZrSi_xO_y$, $HfSi_xO_y$, $La_2O_3$, $ZrO_2$, $HfO_2$, $Ta_2O_5$, $Pr_2O_3$, $TiO_2$. The material of the dummy gate material layer is, for instance, polysilicon. The material of the hard mask layer is, for instance, silicon nitride.

Figure 1E:
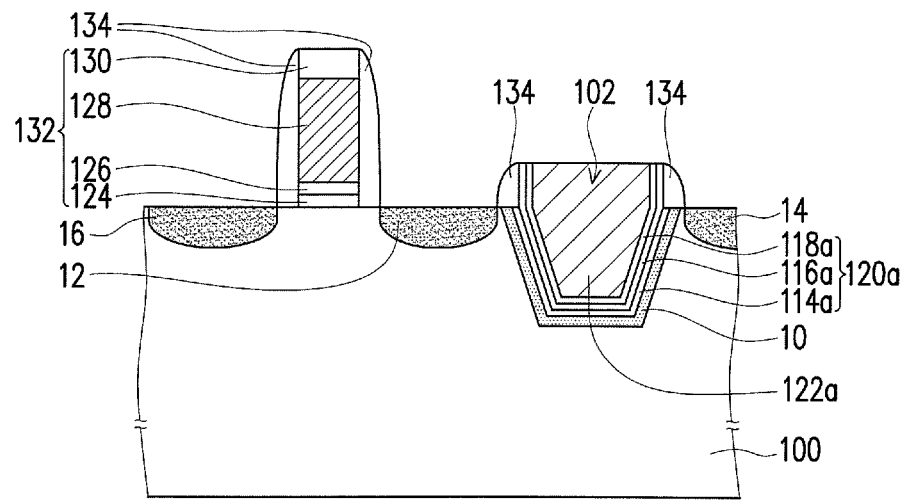

Referring to FIG. 1E, spacers 134 can be formed on the sidewall of the dummy gate structure 132 and on the sidewall of the charge storage structure 120a protruding beyond the substrate 100. The material of the spacers 134 are, for instance, silicon nitride. The method of forming the spacer 134 may be forming a spacer material layer covering the dummy gate structure 132 and the charge storage structure 120a, and then performing an etching back process to the spacer material layer.

Using the dummy gate structure 132, the charge storage structure 120a protruding beyond the substrate 100, and the spacers 134 as a hard mask, an ion implantation process is performed to the substrate, such that lightly doped zones 12, 14, and 16 are formed in the substrate 100 and used as source/drain extension regions. The lightly doped regions 12 and 14 are located in the substrate 100 at two sides of the conductive layer 122a. The lightly doped regions 12 and 16 are located in the substrate 100 at two sides of the dummy gate structure 132, wherein the lightly doped region 12 is located between the conductive layer 122a and the dummy gate structure 132. The conductive type of the lightly doped regions 12, 14, and 16 is, for instance, different from that of the substrate 100.

Figure 1F:
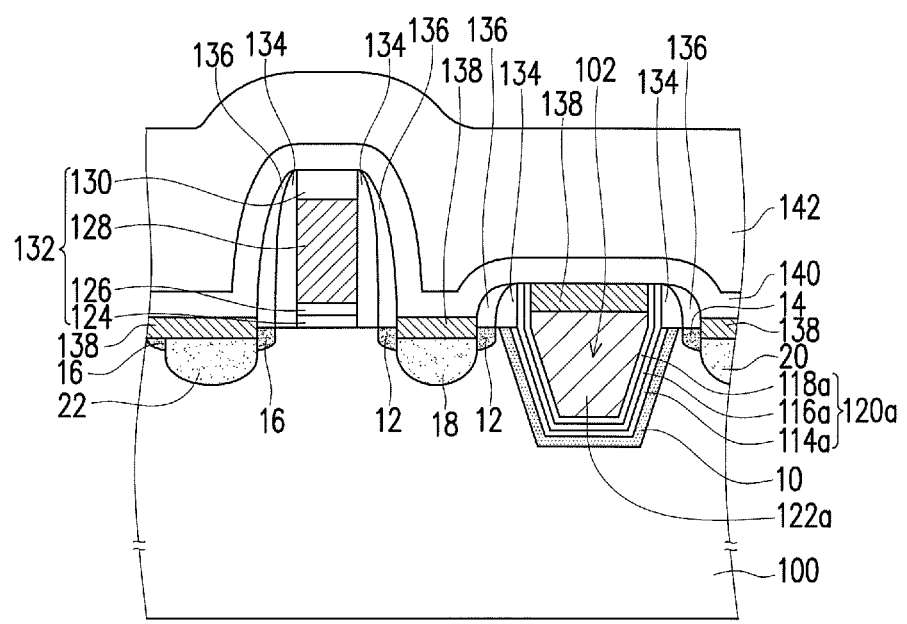

Referring to FIG. 1F, spacers 136 can be formed on the sidewalls of the spacers 134. The material of the spacers 136 are, for instance, silicon nitride. The method of forming the spacers 136 is, for instance, forming a spacer material layer covering the spacers 134, the dummy gate structure 132, and the charge storage structure 120a, and then performing an etching back process to the spacer material layer.

Using the dummy gate structure 132, the charge storage structure 120a protruding beyond the substrate 100, and the spacers 136 as a hard mask, an ion implantation process is performed to the substrate, such that doped regions 18 and 20 are formed in the substrate 100 at two sides of the conductive layer 122a, and the doped regions 18 and 22 are formed in the substrate 100 at two sides of the dummy gate structure 132. The conductive type of the doped regions 18, 20, and 22 may be identical to that of the lightly doped regions 12, 14, and 16. The conductive type of the doped regions 18, 20, and 22 are, for instance, different from that of the substrate 100. The doping depth and the doping concentration of the doped regions 18, 20, and 22 are, for instance, greater than that of the lightly doped regions 12, 14, and 16. The doped region 20 can be the drain or the source of the embedded-type charge storage transistor, and the doped region can be the drain or the source of the selection transistor.

A metal silicide layer 138 can be formed respectively on the conductive layer 122a and the doped regions 18, 20, and 22. The material of the metal silicide layers 138 may be NiSi. Since methods of forming the metal silicide layers 138 are well known to those having ordinary skill in the art, the methods are not repeated herein.

A contact etch stop layer (CESL) 140 and a dielectric material layer 142 covering the dummy gate structure 132 and the metal silicide layers 138 may be formed in order. The material of the CESL 140 is, for instance, silicon nitride. The method of forming the CESL 140 is, for instance, a chemical vapor deposition (CVD) process. The material of the dielectric material layer 142 includes USG or PSG. The method of forming the dielectric material layer 142 is, for instance, chemical vapor deposition. In another embodiment, a CESL 140 is not formed.

Figure 1G:
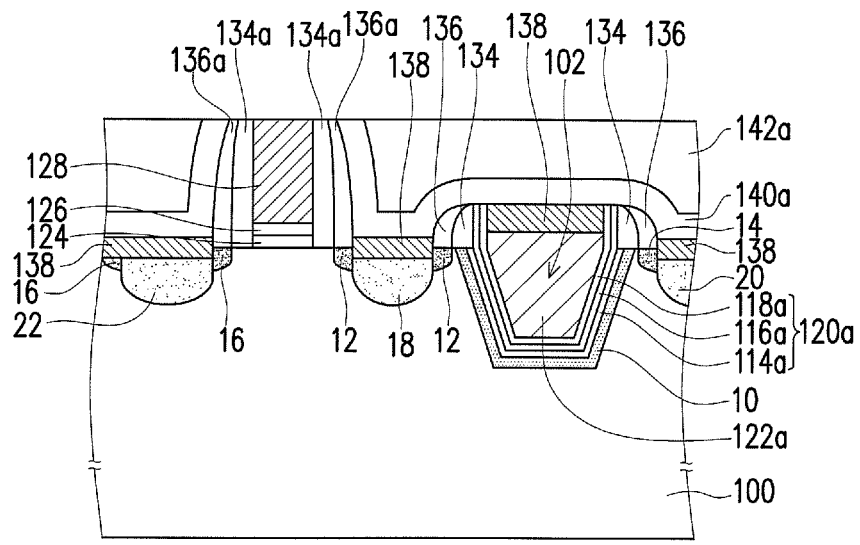

Referring to FIG. 1G, a portion of the dielectric material layer 142 and a portion of the CESL 140 and the hard mask layer 130 are removed until the dummy gate 128 is exposed, such that a dielectric layer 142a and a CESL 140a are formed. The method of removing the portion of the dielectric layer 142a, the portion of the the CESL 140, and the hard mask layer 130 is, for instance, performing a chemical-mechanical polishing process. In this step, a portion of the spacers 134 and a portion of the spacers 136 at two sides of the dummy gate 128 may be removed, such that spacers 134a and 136a are formed.

Figure 1H:
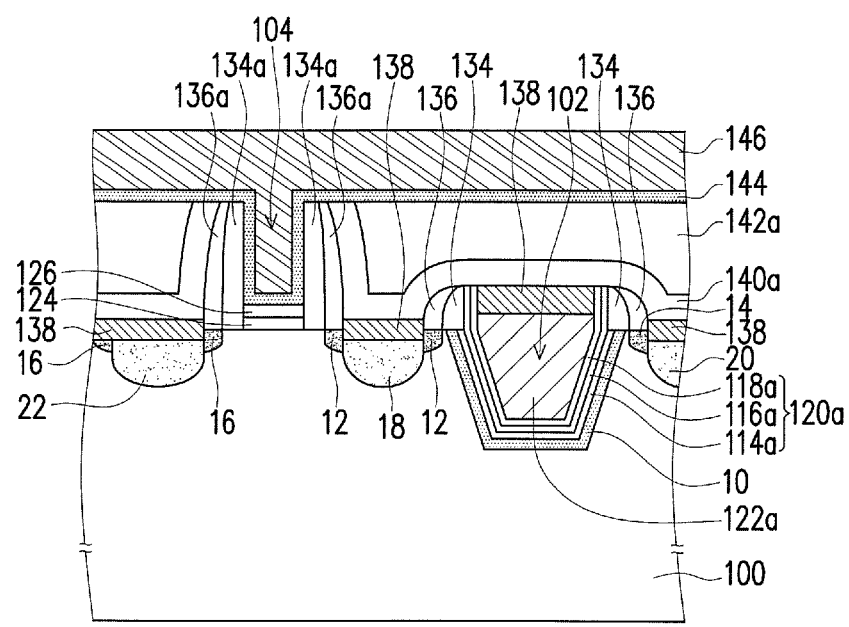

Referring to FIG. 1H, the dummy gate 128 is removed to form a gate opening 104. The method of removing the dummy gate 128 is, for instance, dry etching or wet etching.

A work function metal material layer 144 is conformally formed in the gate opening 104. The material of the work function metal material layer 144 includes TiN, TaC, TaCNO, TaCN, TiAl, or TaN. The material of the work function metal layer 144 includes any material capable of achieving the work function required, and is not limited to the aforementioned materials. The method of forming the work function metal material layer 144 is, for instance, atomic layer deposition (ALD).

A metal gate material layer 146 filling the gate opening 104 is formed on the work function metal material layer 144. The material of the metal gate material layer 146 is, for instance, tungsten or aluminum. The method of forming the metal layer material layer 146 is, for instance, PVD.

Figure 1I:
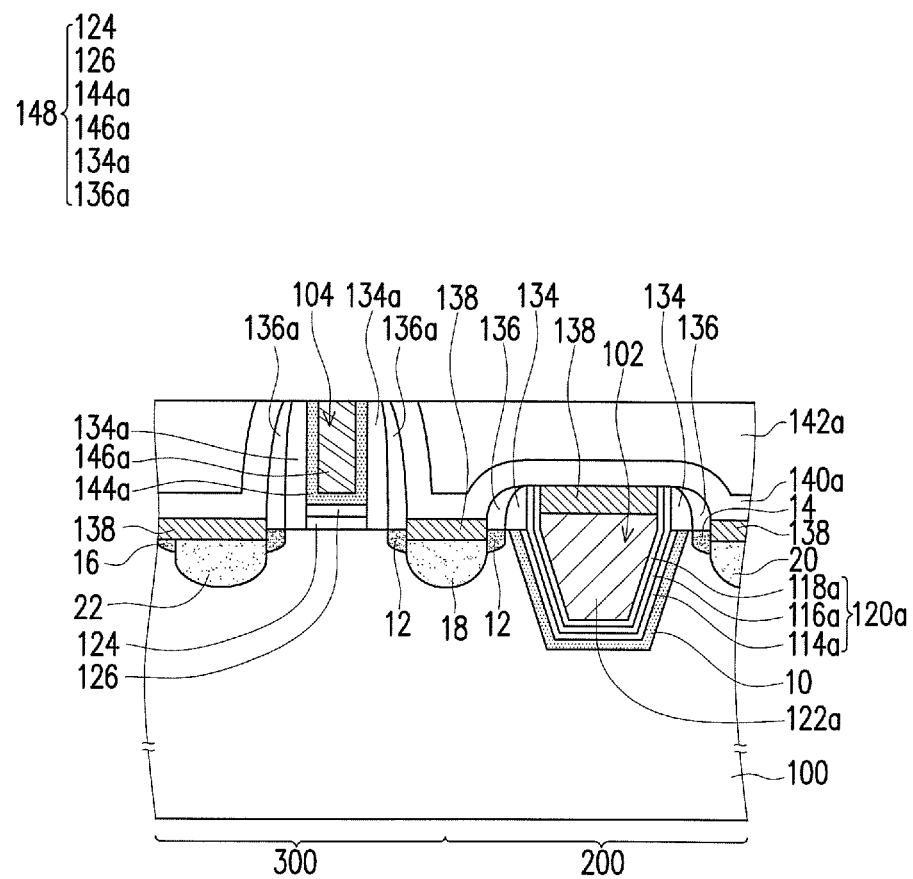

Referring to FIG. 1I., the metal gate material layer 146 and the work function metal material layer 144 outside the gate opening 104 are removed to form a metal gate structure 148 including a work function metal layer 144a and a metal gate layer 146a. The metal gate structure 148 may further include the gate dielectric layer 124, the high-k dielectric layer 126, and spacers 134a and 136a.

Thus far, an embedded-type charge storage transistor 200 has been formed in the substrate 100, and a selection transistor 300 has been formed on the substrate 100 at a side of the embedded-type charge storage transistor 200, such that the fabrication of the non-volatile memory has been completed. Although the non-volatile memory is formed by the aforementioned, the invention is not limited to the method.

Figure 1J:
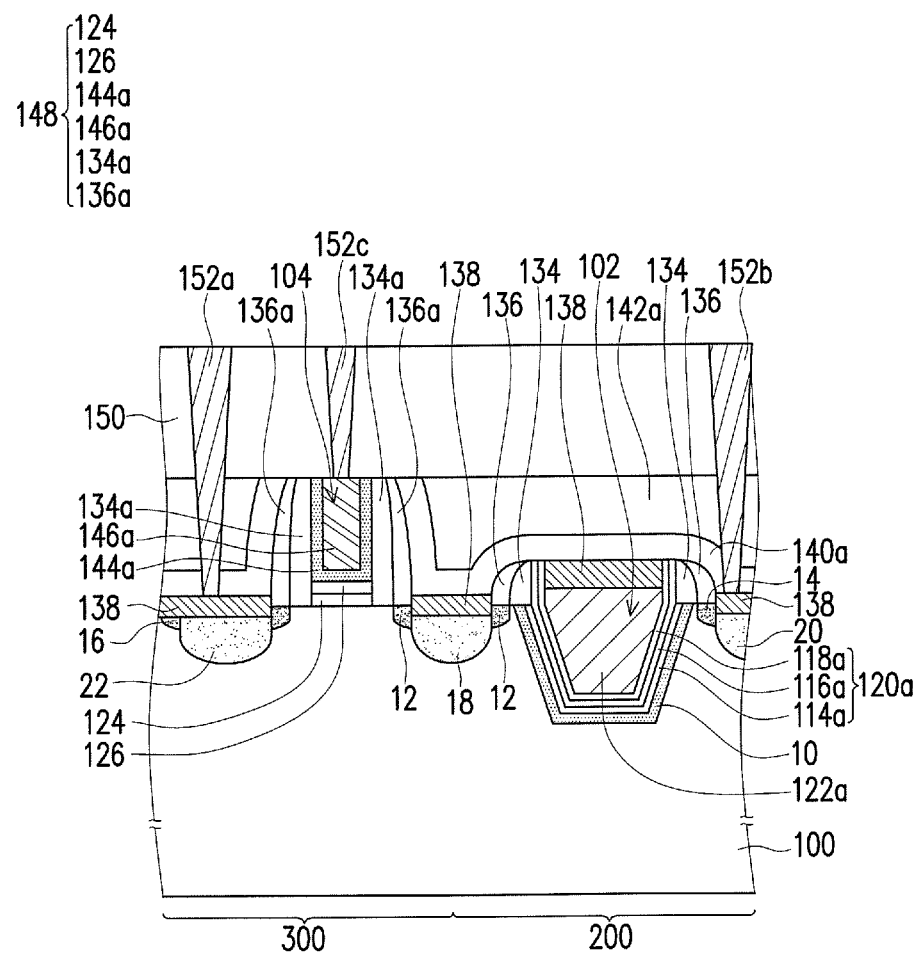

Referring to FIG. 1J, a dielectric layer 150 is formed on the dielectric layer 142a. The material of dielectric layer 150 is, for instance, silicon oxide. The method for forming the dielectric layer 150 is, for instance, a chemical vapor deposition process.

Contacts 152a, 152b, 152c are formed in the dielectric layer. The contact 152a is connected to the metal silicide layer 138 above the doped region 22, and can be used to electrically connect the doped region 22 to a bit line. The contact 152b is connected to the metal silicide layer 138 above the doped region 20, and can be used to electrically connect the doped region 20 to a source line. The contact 152c is connected to the metal gate structure 148, and can be used to electrically connect the metal gate structure 148 to the word line. The material for the contacts 152a, 152b, 152c is, for instance, tungsten, copper, or aluminum. The method of forming the contacts 152a, 152b, 152c is, for instance, metal damascene.

The non-volatile memory of the present embodiment is discussed below with reference to FIG. 1J.

Referring to FIG. 1J, the non-volatile memory includes a substrate 100, an embedded-type charge storage transistor 200, and a selection transistor 300. The substrate 100 has the opening 102. The embedded-type charge storage transistor 200 is disposed in the substrate.

The embedded-type charge storage transistor 200 includes the charge storage structure 120a and the conductive layer 122a. The charge storage structure 120a is disposed on the substrate 100 in the opening 102. The charge storage structure 120a may include the charge trapping layer 116a, and may further include the dielectric layer 114a and the dielectric layer 118a. The dielectric material layer 114a is disposed between the charge trapping layer 116a and the substrate 100. The dielectric layer 118a is disposed between the charge trapping layer 116a and the conductive layer 122a. The conductive layer 122a is disposed on the charge storage structure 120a and fills the opening 102. A portion of the conductive layer 122a and a portion of the charge storage structure 120a may be protruded beyond the top surface of the substrate 100. The embedded-type charge storage transistor 200 may further include the doped regions 18 and 20. The doped regions 18 and 20 are disposed in the substrate 100 at two sides of the conductive layer 122a. The embedded-type charge storage transistor 200 may further optionally include the lightly doped regions 12 and 14. The embedded-type charge storage transistor 200 may further optionally include the spacers 134 and 136. The spacers 134 and 136 are disposed at two sides of the charge storage structure 120a protruded beyond the substrate 100 in order.

The selection transistor 300 is disposed on the substrate 100 at one side of the embedded-type charge storage transistor 200, and the selection transistor 300 includes a metal gate structure 148. The metal gate structure 148 may include the high-k dielectric layer 126, the work function metal layer 144a, and the metal gate layer 146a. The high-k dielectric layer 126, the work function metal layer 144a, and the metal gate layer 146a are disposed on the substrate 100 in order. The dummy gate structure 148 may further include a gate dielectric layer 124. The gate dielectric layer 124 is disposed between the high-k dielectric layer 126 and the substrate 100. The selection transistor may further include the doped regions 18 and 22. The doped regions 18 and 22 are disposed in the substrate 100 at two sides of the metal gate structure 148. The embedded-type charge storage transistor 200 and the selection transistor 300 share the doped region 18. The selection transistor 300 may optionally include the lightly doped regions 12 and 16. The metal gate structure 148 may further optionally include the spacers 134 and 136. The spacers 134a and 136a are disposed at two sides of the metal gate layer 146a in order.

The non-volatile memory may further optionally include at least one of the metal silicide layers 138, CESL 140 and the contacts 152a, 152b, and 152c. The metal silicide layers 138 are respectively disposed on the conductive layer 122a and the doped regions 18, 20, and 22. The CESL 140 is disposed on the spacers 136 and 136a and the metal silicide layers 138. The contacts 152a, 152b, and 152c are disposed in the dielectric layer 142a and the dielectric layer 150. The contact 152a is connected to the metal silicide layer 138 above the doped region 22. The contact 152b is connected to the metal silicide layer 138 above the doped region 20. The contact 152c is connected to the metal gate structure 148.

Furthermore, the materials, dispositions, forming methods, and functions of the elements of the non-volatile memory have been described in detail in the forming method of FIGS. 1A to 1J above, and thereof are not repeated herein.

Based on the embodiments above, since the embedded-type charge storage transistor 200 does not adopt a high-k/metal gate transistor structure, the issue of high-k material trapping charges does not occur. As a result, charges can be readily stored in the charge storage structure 120a, such that the storage capability of the non-volatile memory is increased. Furthermore, since the embedded-type charge storage transistor 200 is disposed in the opening 102 in the substrate 100, the coupling area of the gate capacitance can be increased without taking up additional surface area of the substrate 100. Therefore, the operation voltage of the embedded-type charge storage transistor 200 can be decreased. Additionally, since the selection transistor 300 adopts a high-k/metal gate transistor structure, the issue of punch-through current of the gate and dielectric breakdown can be prevented by increasing the thickness of the high-k dielectric layer 126. Moreover, since the resistance of the metal gate layer 146a is lower than that of a traditional doped polysilicon gate layer or a metal silicide gate layer, the selection transistor 300 adopting the metal gate layer 146a has faster processing speed.

Based on the embodiments above, since in the non-volatile memory and the fabricating method thereof, the embedded-type charge storage transistor does not adopt a high-k/metal gate transistor structure, the issue of high-k material trapping charges does not occur. As a result, the storage capability of the non-volatile memory is increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A non-volatile memory, comprising:
a substrate having an opening;
a first doped region disposed in the substrate along the opening;
an embedded-type charge storage transistor disposed in the substrate, wherein the embedded-type charge storage transistor comprises:
a charge storage structure disposed on the substrate in the opening; and a conductive layer disposed on the charge storage structure and filling the opening; and
a selection transistor disposed on the substrate at one side of the embedded-type charge storage transistor, wherein the selection transistor comprises a metal gate structure.

2. The non-volatile memory of claim 1, wherein the charge storage structure comprises a charge trapping layer.

3. The non-volatile memory of claim 2, wherein a material of the charge trapping layer comprises silicon nitride or nano-dots.

4. The non-volatile memory of claim 2, wherein the charge storage structure further comprises:
a first dielectric layer disposed between the charge trapping layer and the substrate; and
a second dielectric layer disposed between the charge trapping layer and the conductive layer.

5. The non-volatile memory of claim 1, wherein
the embedded-type charge storage transistor further comprises:
a second doped region and a third doped region disposed in the substrate at two sides of the conductive layer,
the selection transistor further comprises:
the second doped region and a fourth doped region disposed in the substrate at two sides of the metal gate structure, and
the embedded-type charge storage transistor and the selection transistor share the second doped region.

6. The non-volatile memory of claim 5, further comprising a plurality of metal silicide layers respectively disposed on the conductive layer, the second doped region, the third doped region, and the fourth doped region.

7. The non-volatile memory of claim 1, wherein the metal gate structure comprises:
a high-k dielectric layer, a work function metal layer, and a metal gate layer, sequentially disposed on the substrate.

8. The non-volatile memory of claim 7, wherein the metal gate structure further comprises:
a gate dielectric layer disposed between the high-k dielectric layer and the substrate.

9. The non-volatile memory of claim 1, wherein the conductive layer protrudes beyond a top surface of the substrate.

10. A method for fabricating a non-volatile memory, comprising:
providing a substrate having an opening;
forming a first doped region in the substrate along the opening;
forming an embedded-type charge storage transistor in the substrate, wherein the embedded-type charge storage transistor comprises:
a charge storage structure disposed on the substrate in the opening; and
a conductive layer disposed on the charge storage structure and filling the opening; and
forming a selection transistor on the substrate at one side of the embedded-type charge storage transistor, wherein the selection transistor comprises a metal gate structure.

11. The method for fabricating the non-volatile memory of claim 10, wherein a method of forming the charge storage structure and the conductive layer comprises:
conformally forming a charge storage structure layer in the opening;
forming a conductive material layer filling the opening on the charge storage structure layer; and
removing the conductive material layer and the charge storage structure layer outside the opening.

12. The method for fabricating the non-volatile memory of claim 11, wherein a method of removing the conductive material layer and the charge storage structure layer outside the opening comprises chemical mechanical polishing or a combination of chemical mechanical polishing and etching back.

13. The method for fabricating the non-volatile memory of claim 10, wherein a method of forming the metal gate structure comprises:
forming a dummy gate structure disposed on the substrate, wherein the dummy gate structure comprises:
a high-k dielectric layer disposed on the substrate;
a dummy gate disposed on the high-k dielectric layer; and
a hard mask layer disposed on the dummy gate;
forming a dielectric material layer covering the dummy gate structure;
removing a portion of the dielectric material layer and the hard mask layer to expose the dummy gate;
removing the dummy gate to form a gate opening; and
forming a work function metal layer and a metal gate layer in the gate opening sequentially.

14. The method for fabricating the non-volatile memory of claim 13, wherein the method of forming the metal gate structure further comprises forming a spacer on a sidewall of the dummy gate structure.

15. The method for fabricating the non-volatile memory of claim 14, further comprising:
forming a second doped region and a third doped region in the substrate at two sides of the conductive layer; and
forming the second doped region and a fourth doped region in the substrate at two sides of the dummy gate structure,
wherein the embedded-type charge storage transistor and the selection transistor share the second doped region.

16. The method for fabricating the non-volatile memory of claim 15, further comprising respectively forming a metal silicide layer on the conductive layer, the second doped region, the third doped region, and the fourth doped region before removing the hard mask layer.

17. The method for fabricating the non-volatile memory of claim 13, wherein the dummy gate structure further comprises:
a gate dielectric layer disposed between the high-k dielectric layer and the substrate.

18. The method for fabricating the non-volatile memory of claim 13, wherein a method of forming the work function metal layer and the metal gate layer comprises:
conformally forming a work function metal material layer in the gate opening;
forming a metal gate material layer filling the gate opening on the work function metal material layer; and
removing the metal gate material layer and the work function metal material layer outside the gate opening.

* * * * *